(12) United States Patent
Shen et al.

(10) Patent No.: US 9,722,831 B2
(45) Date of Patent: Aug. 1, 2017

(54) CARRIER FREQUENCY OFFSET PROCESSING METHOD AND APPARATUS AND RECEIVER

(71) Applicant: SHANGHAI EASTSOFT MICROELECTRONICS CO., LTD., Shanghai (CN)

(72) Inventors: Liwei Shen, Shanghai (CN); Ruijin Liu, Shanghai (CN); Song Pan, Shanghai (CN)

(73) Assignee: SHANGHAI EASTSOFT MICROELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/164,741

(22) Filed: May 25, 2016

(65) Prior Publication Data

US 2016/0277223 A1  Sep. 22, 2016

Related U.S. Application Data

(63) Continuation of application No. PCT/CN2014/078261, filed on May 23, 2014.

(30) Foreign Application Priority Data

Dec. 2, 2013  (CN) .......................... 2013 1 0638087

(51) Int. Cl.
*H04L 27/14* (2006.01)
*H04L 27/152* (2006.01)
(Continued)

(52) U.S. Cl.
CPC .......... *H04L 27/152* (2013.01); *H03J 1/0008* (2013.01); *H04B 1/1027* (2013.01); *H04L 27/148* (2013.01)

(58) Field of Classification Search
CPC ... H04L 27/152; H04L 27/148; H04B 1/1027; H04B 1/30; H03J 1/0008; H03J 7/04
(Continued)

(56) References Cited

U.S. PATENT DOCUMENTS 5,917,735 A * 6/1999 Ko ..................... H03H 17/0275
375/229
7,474,718 B2 * 1/2009 Liu ........................... H03J 7/04
370/514

(Continued)

FOREIGN PATENT DOCUMENTS

CN      1471252 A      1/2004
CN      1741411 A      3/2006
(Continued)

OTHER PUBLICATIONS

International Search Report of corresponding International PCT Application No. PCT/CN2014/078261, dated Aug. 20, 2014.
The Chinese Examination Report of corresponding Chinese patent application No. 201310638087.0, dated Jul. 27, 2016.

*Primary Examiner* — Phuong Phu
(74) *Attorney, Agent, or Firm* — J.C. Patents

(57) ABSTRACT

The invention provides a carrier frequency offset processing method, an apparatus and a receiver. The method comprises: receiving, through a software and hardware interface, an estimated value of frequency offset of a data packet transmitted by an automatic frequency offset control module; collecting the received estimated value of frequency offset of the data packet and performing statistical analysis to obtain a statistical value of carrier frequency offset between a receiving module and a transmitting module; and dynamically adjusting, according to the statistical value of carrier frequency offset, a bandwidth of a low-pass filter through the software and hardware interface. The invention realizes dynamic adjustment of the bandwidth of the low-pass filter in the process of a receiver receiving signals, solving the
(Continued)

problem of the impact on processing performance brought by the fixed bandwidth of a low-pass filter in the prior art.

18 Claims, 4 Drawing Sheets

(51) Int. Cl.
*H04B 1/10* (2006.01)
*H03J 1/00* (2006.01)
*H04L 27/148* (2006.01)

(58) Field of Classification Search
USPC ............................... 375/336, 327, 325, 359
See application file for complete search history.

(56) References Cited

U.S. PATENT DOCUMENTS 7,664,210 B2 * 2/2010 Chong .................... H04B 1/30
 375/326
7,912,437 B2 3/2011 Rahman et al. ............. 455/296

FOREIGN PATENT DOCUMENTS

| | | |
|---|---|---|
| CN | 101032088 A | 9/2007 |
| CN | 101816126 A | 8/2010 |
| CN | 103188067 A | 7/2013 |
| EP | 1 401 164 A1 | 3/2004 |

* cited by examiner

CARRIER FREQUENCY OFFSET PROCESSING METHOD AND APPARATUS AND RECEIVER

CROSS-REFERENCE TO RELATED APPLICATIONS

This application is a continuation of International Application No. PCT/CN2014/078261, filed on May 23, 2014, which claims priority to Chinese Patent Application No. 201310638087.0, filed on Dec. 2, 2013, entitled "CARRIER FREQUENCY OFFSET PROCESSING METHOD AND APPARATUS AND RECEIVER", both of which are hereby incorporated by reference in their entireties.

TECHNICAL FIELD

Embodiments of the invention relate to wireless communication transmission technologies, and in particular to a carrier frequency offset processing method, an apparatus and a receiver.

BACKGROUND

In wireless communication, offset between the crystal oscillator frequencies of a transmitting end and a receiving end, or some other factors (such as different systems, circuits or working environments), results in the carrier frequency of a transmitted signal being not identical with the local oscillator frequency at the receiving end, thus causing carrier frequency offset between the transmitting end and the receiving end. Moreover, the offset frequency between the two ends may also vary with time and the external environment, forming a phenomenon of carrier frequency offset drift. And the carrier frequency offset is also common in wireless communication.

In a currently employed wireless receiving system, a low-pass filter is provided at a receiver to filter out background noise and out of band interference, so as to ensure reception performance of the entire receiver. The low-pass filter is designed such that the transition band thereof is as short as possible and rejection capability of the stopband is as great as possible, for a better filtering effect of noise and interference. And usually, the pass-band width of the low-pass filter is set as a fixed value close to the width of an effective signal.

In the presence of the carrier frequency offset, however, providing a narrow fixed low-pass filter may directly filter out part or all of the useful signals, and even in the case of using feedback compensation, an error would occur in frequency offset estimation, provided that the noise is relatively great or excessive energy is filtered off the effective signal, thus ultimately affecting the entire demodulation performance. And in the case of enlarging the pass-band width of the low-pass filter (e.g. to the sum of the signal bandwidth and a possible maximum carrier frequency offset), greater noise would be introduced, thereby causing a further decline in the reception performance, and particularly, when the carrier frequency offset frequency and the signal bandwidth are comparable with each other, an increase in the bandwidth of the filter would have a significant impact on the performance.

SUMMARY

Embodiments of the invention provide a carrier frequency offset processing method, an apparatus and a receiver, in order to address the problem of the impact on processing performance brought by the fixed bandwidth of a low-pass filter in the presence of carrier frequency offset, and to achieve dynamic adjustment of the bandwidth of the low-pass filter according to the carrier frequency offset.

In a first aspect, an embodiment of the present invention provides a carrier frequency offset processing method, including:

receiving, through a software and hardware interface, an estimated value of frequency offset of a data packet transmitted by an automatic frequency offset control module;

collecting the received estimated value of frequency offset of the data packet and performing statistical analysis to obtain a statistical value of carrier frequency offset between a receiving module and a transmitting module; and dynamically adjusting, according to the statistical value of the carrier frequency offset, a bandwidth of a low-pass filter through the software and hardware interface.

In a second aspect, an embodiment of the present invention provides a carrier frequency offset processing apparatus, including:

a receiving module, configured to receive, through a software and hardware interface, an estimated value of frequency offset of a data packet transmitted by an automatic frequency offset control module;

a frequency offset statistics module, configured to collect the received estimated value of frequency offset of the data packet and perform statistical analysis to obtain a statistical value of carrier frequency offset between a receiving module and a transmitting module; and a bandwidth adjusting module, configured to dynamically adjust, according to the statistical value of the carrier frequency offset, a bandwidth of a low-pass filter through the software and hardware interface.

In a third aspect, an embodiment of the present invention provides a receiver, including:

a software and hardware interface, a local oscillator, a low-pass filter, an automatic frequency offset control module, a demodulator and a carrier frequency offset processing apparatus as described in the second aspect, where the carrier frequency offset processing apparatus is connected and communicates with the local oscillator, the low-pass filter and the automatic frequency offset control module, respectively, through the software and hardware interface.

The carrier frequency offset processing method, the apparatus and the receiver provided by embodiments of the present invention, by calculating the statistical value of the carrier frequency offset between the receiving module and the transmitting module, and dynamically adjusting, according to the statistical value of the carrier frequency offset, the bandwidth of the low-pass filter through the software and hardware interface, realizes dynamic adjustment of the bandwidth of the low-pass filter in the process of a receiver receiving signals, thereby solving the problem of the impact on processing performance brought by the fixed bandwidth of a low-pass filter in the prior art.

BRIEF DESCRIPTION OF THE DRAWINGS

For a clearer description of the technical solutions in embodiments of the present invention, drawings needed for describing the embodiments will be briefly introduced hereafter. And apparently, the drawings as follows illustrate only some embodiments of the present invention, for those skilled in the art, other drawings can be derived from these ones without creative effort.

DESCRIPTION OF EMBODIMENTS

In order to make the purposes, technical solutions and advantages of embodiments of the present invention clearer, the technical solutions of the embodiments of the present invention will be clearly described referring to accompanied drawings thereof. Apparently, the described embodiments are just part rather than all of the embodiments of the present invention. And based on the embodiments of the present invention, all the other embodiments obtained by those skilled in the art without creative effort shall fall into the protection scope of the present invention.

Figure 1:
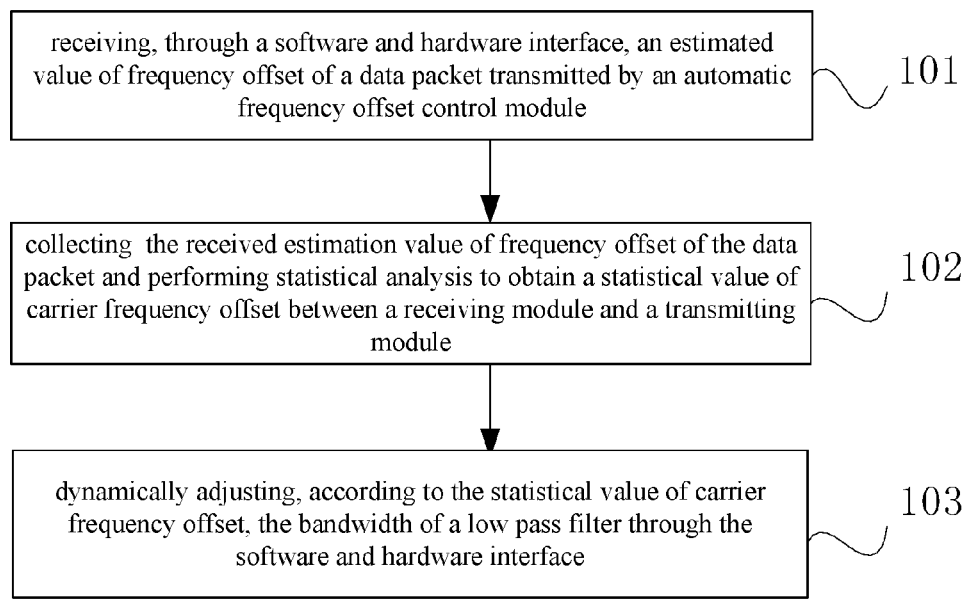
FIG. 1 is a flow chart of a carrier frequency offset processing method according to an embodiment of the present invention.

FIG. 1 is a flow chart of a carrier frequency offset processing method according to an embodiment of the present invention. The method in the embodiment is suitable when carrier frequency offset exists at a receiver. The method is carried out by a carrier frequency offset processing apparatus, which is usually implemented in the form of software and is integrated in a receiver. The method in the embodiment includes the following steps.

Step 101, receiving, through a software and hardware interface, an estimated value of frequency offset of a data packet transmitted by an automatic frequency offset control module.

In this embodiment, specific algorithm of the estimated value of frequency offset of the data packet may adopt the original method of the system, for instance, in regard to frequency-shift keying (FSK), frequency offset may be estimated by calculating the average value of the difference between the maximum frequency and the minimum frequency, and in regard to phase-shift keying (PSK), the output of a loop filter in a carrier recovery loop may be used as the estimated value of frequency offset, where adopting the original estimating algorithm of the frequency offset can guarantee that the structure and performance of carrier frequency offset compensation are free of influence. At the same time, with a larger bandwidth of the matched filter and thus a larger range of trackable carrier frequency offset, the tracking range for the estimating algorithm of the frequency offset may be accordingly widened.

Step 102, collecting the received estimated value of frequency offset of the data packet and performing statistical analysis to obtain a statistical value of carrier frequency offset between a receiving module and a transmitting module.

Since the statistical value of the carrier frequency offset obtained through statistical process is more accurate compared with the estimated value of frequency offset estimated by hardware, the former one is of greater reference significance for the bandwidth adjustment of a low-pass filter and feedback compensation of a local oscillator.

In this embodiment, preferably, collecting the received estimated value of frequency offset of the data packet and performing statistical analysis to obtain a statistical value of carrier frequency offset between a receiving module and a transmitting module, includes: selecting the received estimated value of frequency offset of one data packet as the statistical value of the carrier frequency offset between the receiving module and the transmitting module; or, selecting the average value of the received estimated values of frequency offset of multiple data packets as the statistical value of the carrier frequency offset between the receiving module and the transmitting module. The operation is conducted by receiving multiple data packets, where the estimated value of frequency offset of the carrier obtained from each data packet may be processed to obtain an arithmetical average value, so as to improve the accuracy of the estimated value of frequency offset.

Step 103, dynamically adjusting, according to the statistical value of the carrier frequency offset, the bandwidth of a low-pass filter through the software and hardware interface.

In this step, during specific implementation, a mapping relationship may be established between the statistical value of the carrier frequency offset and the corresponding bandwidth of the low-pass filter, for example, setting some standard carrier frequency offset values V1, V2, V3 . . . Vn respectively corresponding to bandwidths B1, B2, B3 . . . Bn. When the statistical value of the carrier frequency offset is smaller than V1, the bandwidth of the low-pass filter is dynamically adjusted to B1 through the software and hardware interface; and when the statistical value of the carrier frequency offset is greater than V1 but smaller than V2, the bandwidth of the low-pass filter is dynamically adjusted to B2 through the software and hardware interface. Likewise, dynamic adjustment of the bandwidth of the low-pass filter is performed on the basis of the same correspondence.

Specifically, the low-pass filter in this embodiment supports at least two bandwidths, then the dynamic adjustment of the bandwidth of the low-pass filter through the software and hardware interface according to the statistical value of the carrier frequency offset, may also include: during an initialization phase, adjusting the bandwidth of the low-pass filter to a large bandwidth through the software and hardware interface, where the large bandwidth is the sum of a signal bandwidth and a possible maximum carrier frequency offset; during a normal working phase, adjusting the bandwidth of the low-pass filter to a small bandwidth through the software and hardware interface, where the small bandwidth is the signal bandwidth. For example, assume that during the initialization phase of the system, the receiving device and the transmitting device are near each other (for instance, a remote controller will not be far away from a model plane, and the master module is near to the slave module during installation and code matching), so that signals received at the receiving end are of high quality, and software of the receiving module can set the bandwidth of the low-pass filter to a large bandwidth mode, which ensures that the filter will not cause great attenuation to a signal with the carrier frequency offset, and facilitates subsequent estimation of the frequency offset. During the normal working phase, under the small bandwidth mode, the bandwidth of the filter is consistent with the signal bandwidth, which guarantees the performance of the receiver.

Optionally, in the aforementioned embodiment, the low-pass filter can be a single-stage low-pass filter or a multi-stage filter bank.

In contrast to a fixed bandwidth of a low-pass filter adopted by the compensation solution of the carrier frequency offset in the prior art, in which the bandwidth of the low-pass filter has to be enlarged when the carrier frequency offset is relatively large, thus causing a decline in the overall reception performance, this embodiment, by calculating the statistical value of the carrier frequency offset between the receiving module and the transmitting module, and dynamically adjusting, according to the statistical value of the carrier frequency offset, the bandwidth of the low-pass filter through the software and hardware interface, realizes dynamic adjustment of the bandwidth of the low-pass filter in the process of receiving signals by a receiver, thereby solving the problem of the impact on processing performance brought by a fixed bandwidth of a low-pass filter in the prior art.

Figure 2:
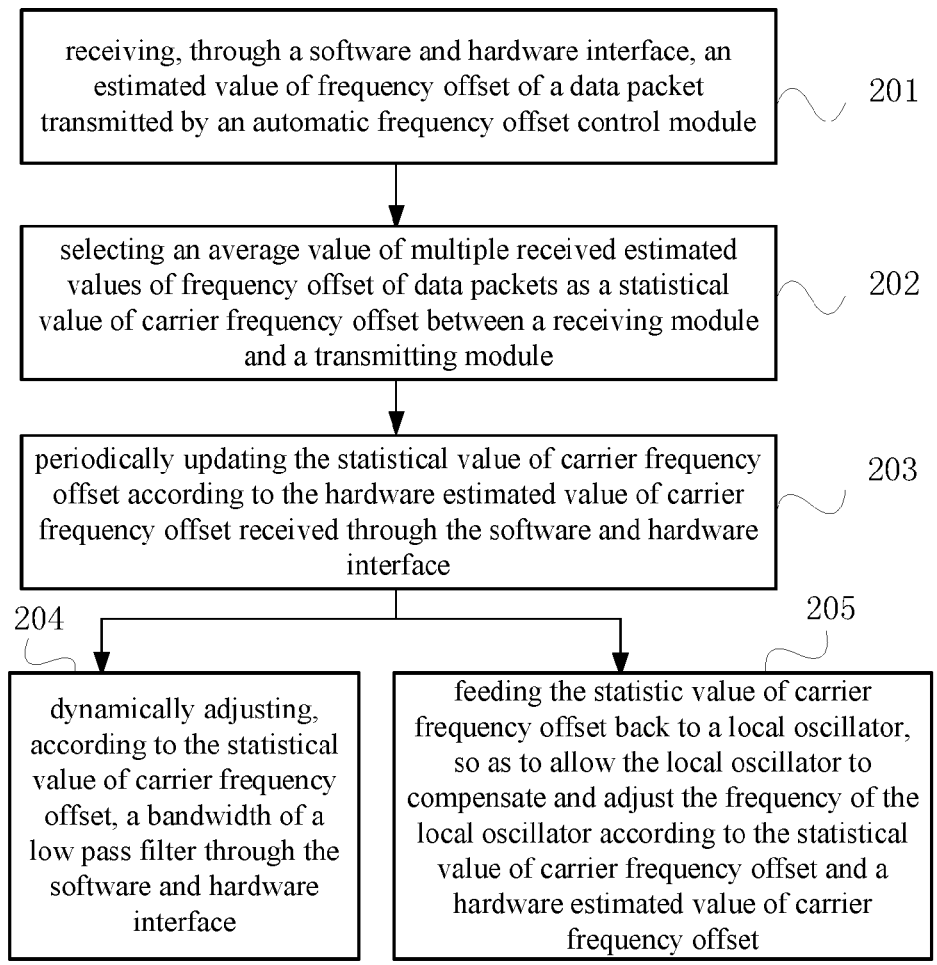
FIG. 2 is a flow chart of a carrier frequency offset processing method according to another embodiment of the present invention.

FIG. 2 is a flow chart of a carrier frequency offset processing method according to another embodiment of the present invention. In this implementation, on the basis of the aforementioned embodiment, additional steps are added, in which the software estimated value of the carrier frequency offset is updated and fed back to a local oscillator, as illustrated in the figure, and the method specifically includes:

Step 201: receiving, through a software and hardware interface, estimated values of frequency offset of data packets transmitted by an automatic frequency offset control module.

Step 202: selecting the average value of the received estimated values of frequency offset of multiple data packets as a statistical value of carrier frequency offset between a receiving module and a transmitting module.

Step 203: periodically updating the statistical value of the carrier frequency offset according to the hardware estimated value of the carrier frequency offset received through the software and hardware interface.

In this step, during the process of receiving data, the hardware estimated value of the carrier frequency offset is read through the software and hardware interface, and the software estimated value of the carrier frequency offset is continuously updated, where the hardware estimated value of the carrier frequency offset refers to the received estimated values of frequency offset of the data packet, and the software estimated/statistical value of the carrier frequency offset refers to the statistical value of carrier frequency offset obtained by collecting the received estimated value of frequency offset of the data packet and performing statistical analysis. During specific implementation, a timer can be set to periodically update the statistical value of the carrier frequency offset based on the time difference, for instance, taking a weighted average of the read hardware estimated value of the carrier frequency offset and the original software estimated value of the carrier frequency offset. Since in actual working environment, the shift rate of the carrier frequency offset is generally low, therefore, it is possible to keep tracking the shift of the frequency offset as long as a certain communication frequency is maintained at the receiving and transmitting ends.

Step 204: dynamically adjusting, according to the statistical value of the carrier frequency offset, the bandwidth of the low-pass filter through the software and hardware interface.

Step 205: feeding the statistical value of the carrier frequency offset back to the local oscillator, so as to allow the local oscillator to compensate and adjust the frequency of the local oscillator according to the statistical value of the carrier frequency offset and the hardware estimated value of the carrier frequency offset.

In this step, the software estimated value of the carrier frequency offset is set to a local oscillation generator, so as to control the carrier frequency offset at the receiving and transmitting ends within a very small range, therefore, when receiving data, the low-pass filter can be set to small bandwidth mode to ensure the reception performance of the receiver. And likewise, when transmitting data, the carrier frequency offset at the receiving and transmitting ends can be reduced by compensating the frequency of the local oscillation generator. It should be noted that, the carrier compensation is only required at either master side or slave side, usually at slave side, so that the carrier frequency of all slave modules in the system may approach that of the master module.

In this embodiment, adding the steps of feeding the software estimated value of the carrier frequency offset back to the local oscillator, as well as updating the software statistical value of the carrier frequency offset, makes it possible for the present invention to combine software and hardware, thus widening the capturing range of the carrier frequency offset, without affecting the reception performance or enlarging the original circuit scale or lengthening the training sequence which affects the original communication efficiency. The process is also not subject to specific modulation mode, and is compatible with a variety of wireless transmission modes.

Figure 3:
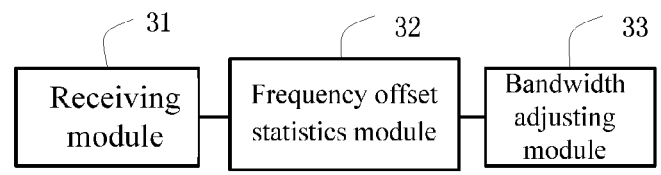
FIG. 3 is a structure diagram of a carrier frequency offset processing apparatus according to an embodiment of the present invention.

FIG. 3 is a structure diagram of a carrier frequency offset processing apparatus according to an embodiment of the present invention. As illustrated in FIG. 3, the apparatus in the embodiment may include: a receiving module 31, a frequency offset statistics module 32 and a bandwidth adjusting module 33, in which, the receiving module 31 is configured to receive, through a software and hardware interface, an estimated value of frequency offset of a data packet transmitted by an automatic frequency offset control module;

the frequency offset statistics module 32 is configured to collect the received estimated value of frequency offset of the data packet and perform statistical analysis to obtain a statistical value of carrier frequency offset between a receiving module and a transmitting module;

the bandwidth adjusting module 33 is used to dynamically adjust, according to the statistical value of carrier frequency offset, the bandwidth of a low-pass filter through the software and hardware interface.

The apparatus in the embodiment can be used to execute the technical solutions of the embodiment of the carrier frequency offset processing method illustrated in FIG. 1 of the present invention. And the apparatus is provided with function modules corresponding to each step, the implementing principle and technical effect thereof are similar to the above description and will not be repeated here.

Figure 4:
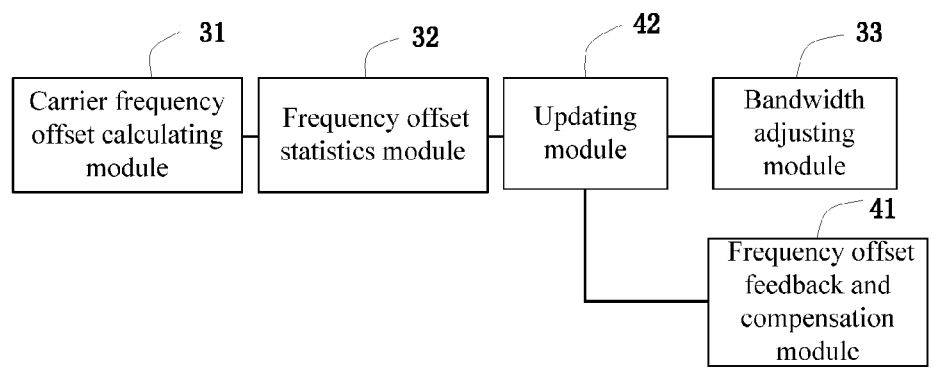
FIG. 4 is a structure diagram of a carrier frequency offset processing apparatus according to another embodiment of the present invention.

FIG. 4 is a structure diagram of a carrier frequency offset processing apparatus according to another embodiment of the present invention. As illustrated in FIG. 4, the apparatus in this embodiment, on the basis of the apparatus structure illustrated in FIG. 3, may further include: a frequency offset feedback and compensation module 41 and an updating module 42, in which the frequency offset feedback and compensation module 41 is configured to feedback the software estimated value of the carrier frequency offset to a local oscillator, allowing the local oscillator to compensate and adjust the frequency of the local oscillator according to the software estimated value of the carrier frequency offset and the hardware estimated value of the carrier frequency offset; and the updating module 42 is configured to periodically update the software estimated value of the carrier frequency offset according to the hardware estimated value of the carrier frequency offset received through the software and hardware interface, before the bandwidth adjusting module dynamically adjusts, according to the software estimated value of the carrier frequency offset, the bandwidth of the low-pass filter through the software and hardware interface.

Preferably, the frequency offset statistics module 32 is specially configured to: according to calculation, take the received frequency offset value of one data packet as the software estimated value of the carrier frequency offset between a receiving module and a transmitting module; or, according to calculation, take an average value of the received frequency offset values of multiple data packets as the software estimated value of the carrier frequency offset between the receiving module and the transmitting module.

Further, the low-pass filter supports at least two bandwidths, and the bandwidth adjusting module 33 is specially configured to: during an initialization phase, adjust the bandwidth of the low-pass filter to a large bandwidth through the software and hardware interface, where the large bandwidth is the sum of a signal bandwidth and the maximum software estimated value of the carrier frequency offset; and during a normal working phase, adjust the bandwidth of the low-pass filter to a small bandwidth through the software and hardware interface, where the small bandwidth is the signal bandwidth.

Further, the low-pass filter that the bandwidth adjusting module 33 adjusts is a single-stage low-pass filter or a multi-stage filter bank.

The apparatus in this embodiment can be used to execute the technical solutions of the embodiment of the method illustrated in FIG. 2, where the implementing principle and technical effect thereof are similar to the above description and will not be repeated here.

Figure 5:
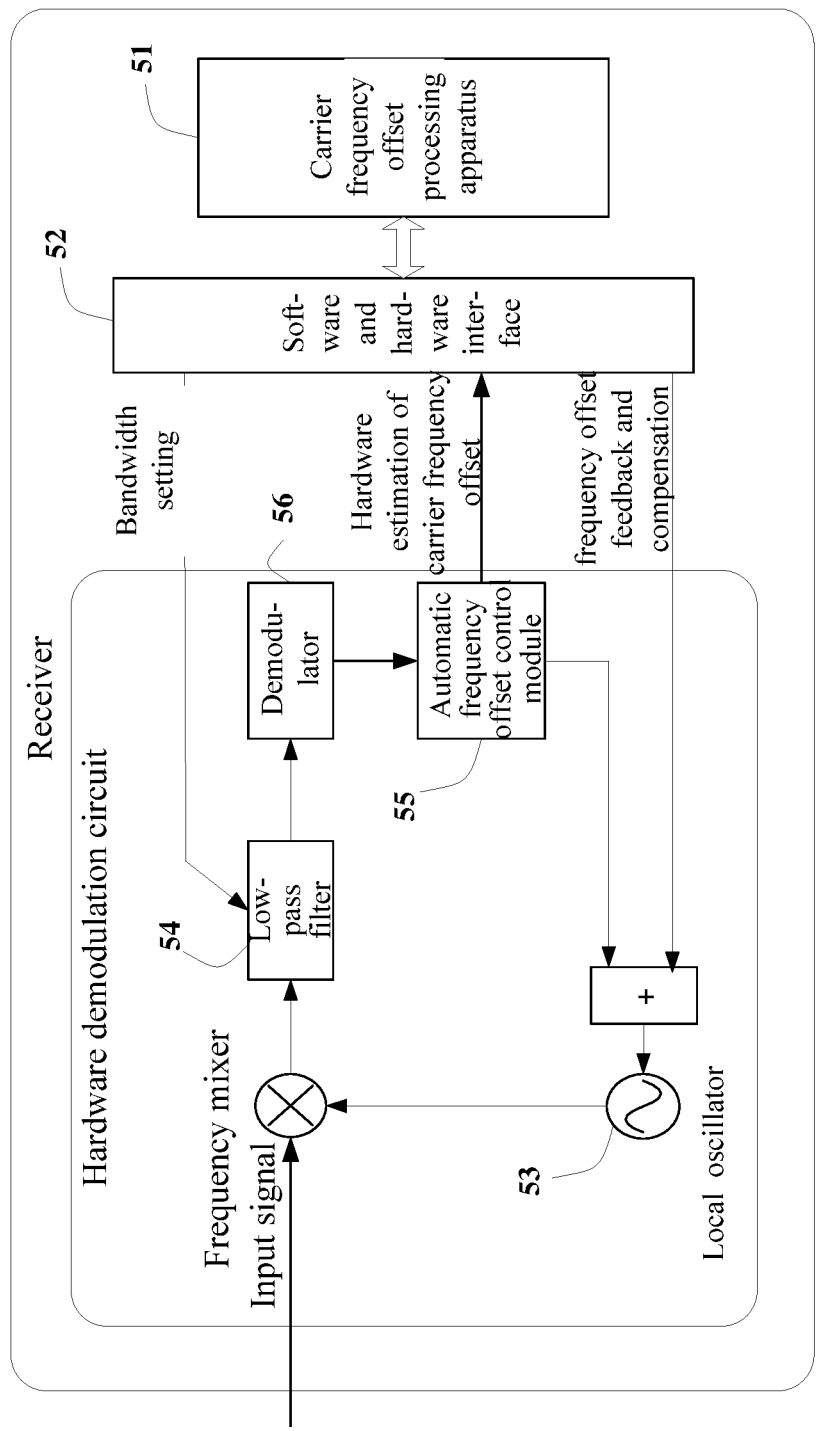
FIG. 5 is a structure diagram of a receiver according to an embodiment of the present invention.

FIG. 5 is a structure diagram of a receiver according to an embodiment of the present invention. As illustrated in FIG. 5, the receiver includes a carrier frequency offset processing apparatus 51, a software and hardware interface 52, a local oscillator 53, a low-pass filter 54, an automatic frequency offset control module 55 and a demodulator 56, where the carrier frequency offset processing apparatus 51 is respectively connected and communicates with the local oscillator 53, the low-pass filter 54 and the automatic frequency offset control module 55 through the software and hardware interface 52.

The carrier frequency offset processing apparatus 51 may adopt the structure of the apparatus embodiment as illustrated in FIG. 3 or FIG. 4, and correspondingly execute the technical solutions of the method embodiment as illustrated in FIG. 1 or FIG. 2, where the implementing principle and technical effect thereof are similar to the above description and will not be repeated here.

It can be appreciated by those skilled in the art that: all or part of the steps to realize the embodiments of the method can be conducted by hardware related to program instructions. The foregoing programs can be stored in a computer readable storage medium. During execution, the program executes the steps in the aforementioned embodiments of the method; and aforementioned storage medium includes ROM, RAM, disk or CD and various media that can store program code.

Finally, it should be noted that the above embodiments are merely for illustration, rather than to limit the technical solutions of the present invention; despite the detailed description made by the aforementioned embodiments of the present invention, those skilled in the art should understand that modifications can be made to the technical solutions described in the above embodiments, or that equivalent replacements can be made to part or all of the technical features; and neither these modifications nor these equivalent replacements shall make essence of the technical solutions depart from the scope of the technical solutions of the various embodiments of the present invention.

What is claimed is:

1. A carrier frequency offset processing method, comprising:

receiving, through a software and hardware interface, an estimated value of frequency offset of a data packet transmitted by an automatic frequency offset control module;

collecting the received estimated value of frequency offset of the data packet and performing statistical analysis on the collected estimated value of frequency offset of the data packet to obtain a statistical value of carrier frequency offset between a receiving module and a transmitting module;

dynamically adjusting, according to the statistical value of the carrier frequency offset, a bandwidth of a low-pass filter through the software and hardware interface; and feeding the statistical value of carrier frequency offset back to a local oscillator, so as to allow the local oscillator to compensate and adjust a frequency of the local oscillator according to the statistical value of carrier frequency offset and the estimated value of carrier frequency offset.

2. The method according to claim 1, further comprising:
periodically updating the statistical value of carrier frequency offset according to the hardware estimated value of carrier frequency offset received through the software and hardware interface.

3. The method according to claim 1, wherein, the collecting the received estimated value of frequency offset of the data packet and performing statistical analysis to obtain a statistical value of carrier frequency offset between a receiving module and a transmitting module, comprises:

selecting the received estimated value of frequency offset of one data packet as the statistical value of carrier frequency offset between the receiving module and the transmitting module.

4. The method according to claim 1, wherein, the collecting the received estimated value of frequency offset of the data packet and performing statistical analysis to obtain a statistical value of carrier frequency offset between a receiving module and a transmitting module, comprises:

selecting an average value of the received estimated values of frequency offset of multiple data packets as the statistical value of carrier frequency offset between the receiving module and the transmitting module.

5. The method according to claim 1, wherein, the low-pass filter supports at least two bandwidths, and the dynamically adjusting, according to the statistical value of the carrier frequency offset, a bandwidth of a low-pass filter through the software and hardware interface comprises:

adjusting, during an initialization phase, the bandwidth of the low-pass filter to a large bandwidth through the software and hardware interface, wherein the large bandwidth is a sum of a signal bandwidth and a possible maximum carrier frequency offset; and adjusting, during a normal working phase, the bandwidth of the low-pass filter to a small bandwidth through the software and hardware interface, wherein the small bandwidth is the signal bandwidth.

6. The method according to claim 5, wherein, the low-pass filter is a single-stage low-pass filter or a multi-stage filter bank.

7. A carrier frequency offset processing apparatus, comprising a processor executing program codes stored in a non-transitory processor-readable medium, which configures the apparatus to:
receive, through a software and hardware interface, an estimated value of frequency offset of a data packet transmitted by an automatic frequency offset control module;
collect the received estimated value of frequency offset of the data packet and perform statistical analysis on the collected estimated value of frequency offset of the data packet to obtain a statistical value of carrier frequency offset between a receiving module and a transmitting module;
dynamically adjust, according to the statistical value of the carrier frequency offset, a bandwidth of a low-pass filter through the software and hardware interface; and
feed back the statistical value of carrier frequency offset to a local oscillator, so as to allow the local oscillator to compensate and adjust a frequency of the local oscillator according to the statistical value of carrier frequency offset and the estimated value of carrier frequency offset.

8. The apparatus according to claim 7, wherein the apparatus is further configured to:
periodically update the statistical value of carrier frequency offset according to the hardware estimated value of carrier frequency offset received through the software and hardware interface.

9. The apparatus according to claim 7, wherein, the apparatus is specifically configured to:
select the received estimated value of frequency offset of one data packet as the statistical value of carrier frequency offset between the receiving module and the transmitting module.

10. The apparatus according to claim 7, wherein, the apparatus is specifically configured to:
select an average value of the received estimated values of frequency offset of multiple data packets as the statistical value of carrier frequency offset between the receiving module and the transmitting module.

11. The apparatus according to claim 7, wherein, the low-pass filter supports at least two bandwidths, and the apparatus is specifically configured to:
adjust, during an initialization phase, the bandwidth of the low-pass filter to a large bandwidth through the software and hardware interface, wherein the large bandwidth is a sum of a signal bandwidth and a possible maximum carrier frequency offset; and
adjust, during a normal working phase, the bandwidth of the low-pass filter to a small bandwidth through the software and hardware interface, wherein the small bandwidth is the signal bandwidth.

12. The apparatus according to claim 11, wherein, the adjusted low-pass filter is a single-stage low-pass filter or a multi-stage filter bank.

13. A receiver, comprising a software and hardware interface, a local oscillator, a low-pass filter, an automatic frequency offset control module, a demodulator and a carrier frequency offset processing apparatus, wherein the carrier frequency offset processing apparatus is respectively connected and communicates with the local oscillator, the low-pass filter and the automatic frequency offset control module through the software and hardware interface;
wherein the carrier frequency offset processing apparatus comprises a processor executing program codes stored in a non-transitory processor-readable medium, which configures the carrier frequency offset processing apparatus to:
receive, through the software and hardware interface, an estimated value of frequency offset of a data packet transmitted by the automatic frequency offset control module;
collect the received estimated value of frequency offset of the data packet and perform statistical analysis on the collected estimated value of frequency offset of the data packet to obtain a statistical value of carrier frequency offset between a receiving module and a transmitting module;
dynamically adjust, according to the statistical value of the carrier frequency offset, a bandwidth of the low-pass filter through the software and hardware interface; and
feed back the statistical value of carrier frequency offset to the local oscillator, so as to allow the local oscillator to compensate and adjust a frequency of the local oscillator according to the statistical value of carrier frequency offset and the estimated value of carrier frequency offset.

14. The receiver according to claim 13, wherein the carrier frequency offset processing apparatus is further configured to:
periodically update the statistical value of carrier frequency offset according to the hardware estimated value of carrier frequency offset received through the software and hardware interface.

15. The receiver according to claim 13, wherein, the carrier frequency offset processing apparatus is specifically configured to:
select the received estimated value of frequency offset of one data packet as the statistical value of carrier frequency offset between the receiving module and the transmitting module.

16. The receiver according to claim 13, wherein, the carrier frequency offset processing apparatus is specifically configured to:
select an average value of the received estimated values of frequency offset of multiple data packets as the statistical value of carrier frequency offset between the receiving module and the transmitting module.

17. The receiver according to claim 13, wherein, the low-pass filter supports at least two bandwidths, and the carrier frequency offset processing apparatus is specifically configured to:
adjust, during an initialization phase, the bandwidth of the low-pass filter to a large bandwidth through the software and hardware interface, wherein the large bandwidth is a sum of a signal bandwidth and a possible maximum carrier frequency offset; and
adjust, during a normal working phase, the bandwidth of the low-pass filter to a small bandwidth through the software and hardware interface, wherein the small bandwidth is the signal bandwidth.

18. The receiver according to claim 17, wherein, the adjusted low-pass filter is a single-stage low-pass filter or a multi-stage filter bank.

* * * * *